(12) United States Patent
Kretchmer et al.

(10) Patent No.: US 7,285,433 B2
(45) Date of Patent: Oct. 23, 2007

(54) INTEGRATED DEVICES WITH OPTICAL AND ELECTRICAL ISOLATION AND METHOD FOR MAKING

(75) Inventors: James William Kretchmer, Ballston Spa, NY (US); Jeffrey Bernard Fedison, Niskayuna, NY (US); Dal Marius Brown, Schenectady, NY (US); Peter Micah Sandvik, Guilderland, NY (US)

(73) Assignee: General Electric Company, Niskayuna, NY (US)

( * ) Notice: Subject to any disclaimer, the term of this patent is extended or adjusted under 35 U.S.C. 154(b) by 330 days.

(21) Appl. No.: 10/701,534

(22) Filed: Nov. 6, 2003

(65) Prior Publication Data

US 2005/0101100 A1 May 12, 2005

(51) Int. Cl.
*H01L 21/00* (2006.01)
*H01L 21/76* (2006.01)
*H01L 29/00* (2006.01)

(52) U.S. Cl. .......................... 438/24; 438/48; 438/400; 257/510

(58) Field of Classification Search .................. 438/24, 438/48, 218, 294, 400, 429; 257/510
See application file for complete search history.

(56) References Cited

U.S. PATENT DOCUMENTS

| | | | |
|---|---|---|---|
| 5,394,005 A | | 2/1995 | Brown et al. |
| 5,498,566 A | * | 3/1996 | Lee .............................. 438/425 |
| 5,763,315 A | | 6/1998 | Benedict et al. |
| 6,063,693 A | * | 5/2000 | Soderbarg et al. .......... 438/432 |
| 6,146,970 A | * | 11/2000 | Witek et al. ................. 438/424 |
| 6,239,001 B1 | * | 5/2001 | Takaishi ...................... 438/431 |
| 6,239,434 B1 | | 5/2001 | Brown |
| 6,294,820 B1 | * | 9/2001 | Lucas et al. ................. 257/412 |
| 6,303,413 B1 | | 10/2001 | Kalnitsky et al. |
| 6,547,146 B1 | * | 4/2003 | Meksavan et al. ...... 235/462.46 |
| 6,607,967 B1 | * | 8/2003 | Pallinti et al. ............... 438/411 |
| 2002/0066960 A1 | * | 6/2002 | Ring ........................... 257/774 |
| 2002/0074556 A1 | * | 6/2002 | Kwak et al. ................... 257/79 |
| 2003/0013270 A1 | * | 1/2003 | Seitz ........................... 438/424 |
| 2004/0089914 A1 | * | 5/2004 | Mouli et al. ................. 257/510 |
| 2004/0175897 A1 | * | 9/2004 | Wensley et al. ............ 438/386 |

OTHER PUBLICATIONS

M. Nandakumar, A. Chatterjee, S. Sridhar, J. Joyner, M. Rodder and I.-C.Chen, "Shallow Trench Isolation for Advanced ULSI CMOS Technologies," IEEE International Electron Devices Meeting, IEDM '98 Technical Digest., pp. 133-136 (1998).
Dale M. Brown, Evan T. Downey, Mario Ghezzo, James W. Kretchmer, Richard J. Saia, Yung S. Liu, John A. Edmond, George Gati, Joseph M. Pimbley and William E. Schneider, "Silicon Carbide UV Photodiodes," IEEE Transactions on Electron Devices, vol. 40, No. 2, Feb. 1993, p. 325-333.
Dale M. Brown, Evan Downey, Jim Kretchmer, Gerald Michon, Emily Shu and Don Schneider, "SiC Flame Sensors for Gas Turbine Control Systems," Solid-State Electronics, vol. 42, No. 5, p. 755-760 (1998).

* cited by examiner

*Primary Examiner*—Hsien-Ming Lee
(74) *Attorney, Agent, or Firm*—Fletcher Yoder

(57) ABSTRACT

The invention is directed to a method for optical and electrical isolation between adjacent integrated devices. The method comprises the steps of forming at least one trench through an exposed surface of a semiconductor wafer by removing a portion of the semiconductor wafer material, forming an electrically insulating layer on the sidewalls and the bottom of the at least one trench, filling the at least one trench by conformally depositing an optically isolating material, and planarizing the semiconductor wafer surface by removing the portion of the optically isolating material above the exposed surface of the semiconductor wafer.

22 Claims, 9 Drawing Sheets

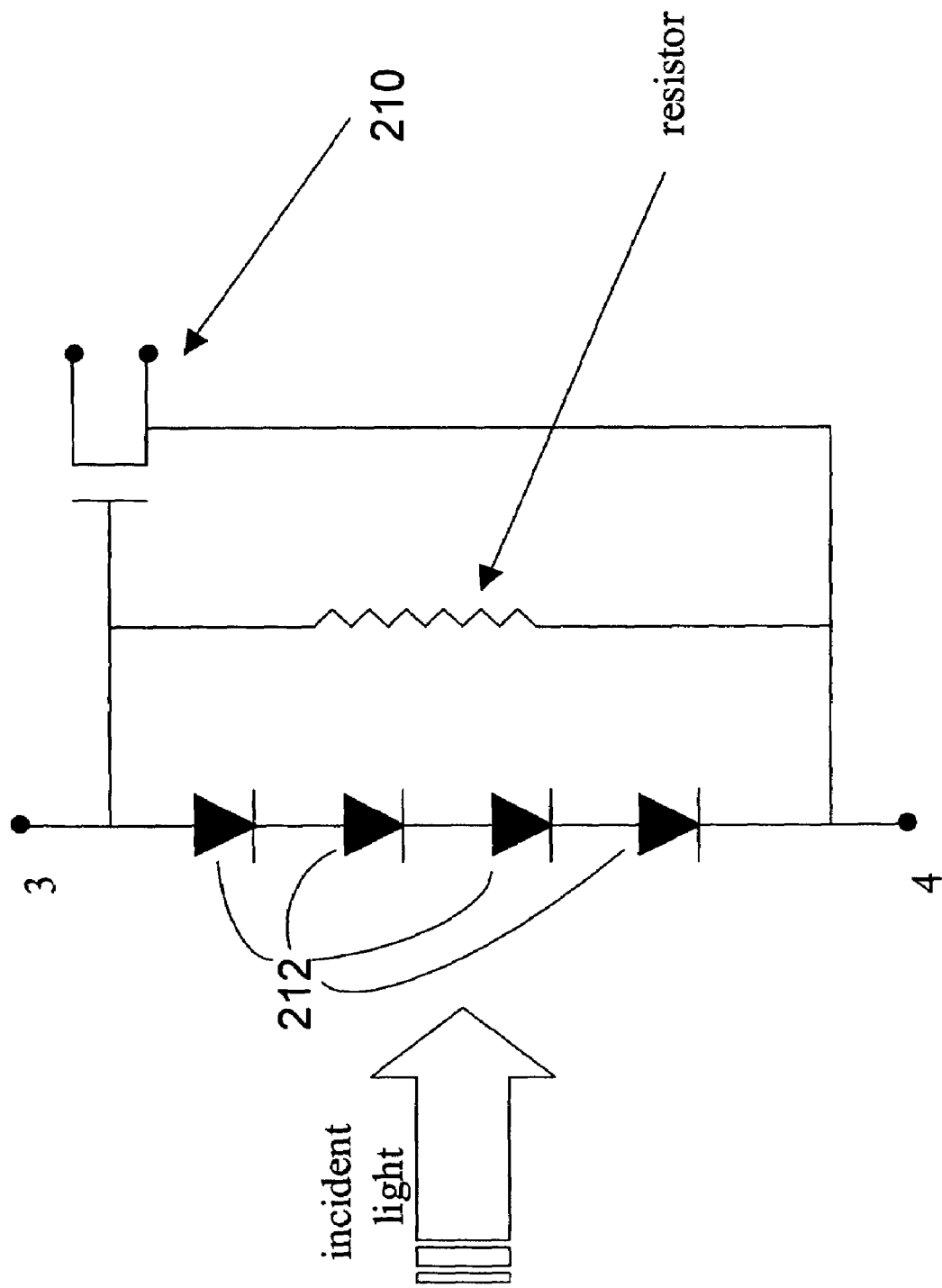

INTEGRATED DEVICES WITH OPTICAL AND ELECTRICAL ISOLATION AND METHOD FOR MAKING

BACKGROUND OF THE INVENTION

The present invention relates generally to the field of microelectronics and more particularly to a method and structure for optical and electrical isolation between adjacent integrated devices.

Optical and electrical isolation between active devices is often an important requirement for integrated micro-systems, especially those involving optical sensors. A number of solutions to electrically isolate adjacent devices are available, including local oxidation of silicon (LOCOS), shallow trench isolation (STI) and deep trench isolation (DTI). When properly designed, these isolation structures can reduce unwanted diffusion of dopants, prevent and/or reduce capacitance coupling, or prevent latch-up between adjacent devices. However, these solutions do not provide any optical isolation between adjacent devices. In addition, a LOCOS structure usually leaves a wafer with a non-planar top surface, which can cause difficulties for subsequent fabrication processes. Depending on the trench depths, traditional trench isolation methods often require a significant amount of trench-filling material to be deposited, which often necessitates additional effort in the planarization step(s).

These and other drawbacks exist in known systems and techniques.

BRIEF SUMMARY OF THE INVENTION

The present invention is directed to a method and structure for optical and electrical isolation between adjacent integrated devices that overcome these and other drawbacks of known systems and methods.

According to one embodiment, the invention relates to a method for optical and electrical isolation between adjacent integrated devices comprising the steps of forming at least one trench through an exposed surface of a semiconductor wafer by removing a portion of the semiconductor wafer material, forming an electrically insulating layer on the sidewalls and the bottom of the at least one trench, filling the at least one trench by conformally depositing an optically isolating material, and planarizing the semiconductor wafer surface by removing the portion of the optically isolating material above the exposed surface of the semiconductor wafer.

According to another embodiment, the invention relates to a microelectronic device comprising at least two integrated devices, wherein the at least two integrated devices are located in a substrate, and at least one trench in the substrate, wherein the at least one trench physically separates the at least two integrated devices, and the inside of the at least one trench is coated with an electrically insulating material and filled with an optically isolating material that is conformally deposited.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

FIG. 11 shows an exemplary circuit making use of a serially connected set of diodes to power certain types of transistors.

DETAILED DESCRIPTION OF THE INVENTION

Reference will now be made in detail to exemplary embodiments of the invention, examples of which are illustrated in the accompanying drawings.

Figure 1:
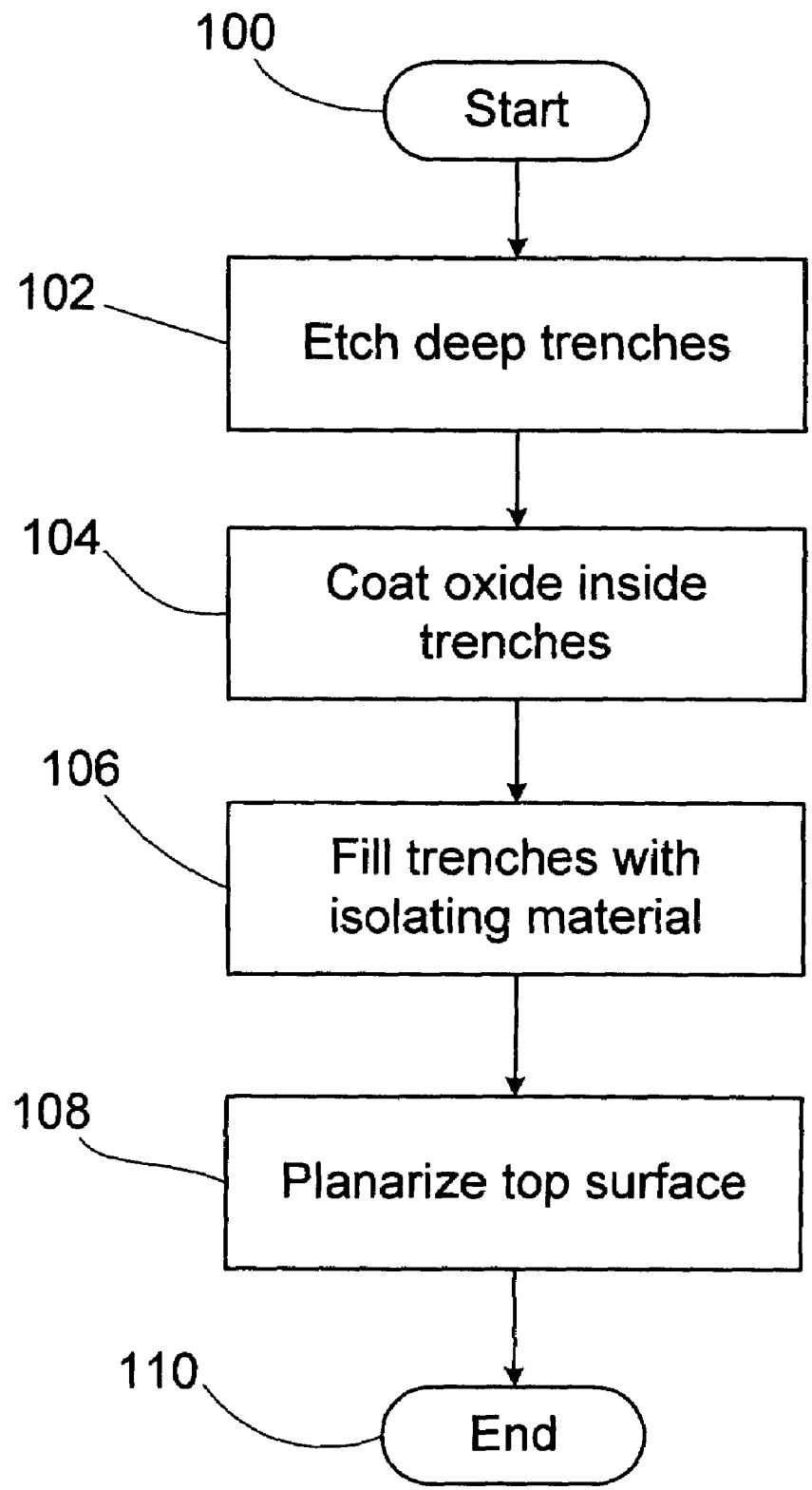
FIG. 1 is a flow chart illustrating a method for optical and electrical isolation between adjacent integrated devices according to an exemplary embodiment of the invention.

FIG. 1 is a flow chart illustrating a method for optical and electrical isolation between adjacent integrated devices according to an exemplary embodiment of the invention.

The process starts at step 100. The optical and electrical isolation method may be implemented, for example, on a piece of semiconductor wafer in which a plurality of integrated devices, such as photodiodes, photodetectors and other optical sensors, photoemitters, other electronic devices/circuits, and/or micro-electromechanical structures (MEMS) are to be fabricated. At step 100, there may be implant regions of different dopant types and doping density defined in the semiconductor wafer. Or future device sites in the wafer may be defined or identified in other manners known to those skilled in the art such as epitaxial layer formation.

At step 102, deep trenches are etched into the exposed surface of the semiconductor wafer. For example, to implement trenches that span a large rectangular area (e.g., greater than 10 microns), a series of narrow trenches (e.g., 3 microns wide or narrower) may be etched in this rectangular area. The trench locations may be selected so as to physically separate adjacent integrated devices that need to be isolated. The openings of the deep trenches may take any suitable shapes, such as polygons, depending on the geography of the devices being isolated and the photolithography or etching techniques.

The depths of the trenches may be several microns ($\mu$m), e.g., 5 $\mu$m or more. Trench depths of up to 100 microns may be utilized in some cases. However, more typically, depths of less than 10 microns are utilized. Typically the trenches have an aspect ratio (trench depth divided by width) greater than 0.5 and less than 5, with a more preferred range of greater than 1 but less than 3. The trenches are typically narrow enough to be filled. For example, a 3.0 micron trench may be filled by a conformal film of polysilicon slightly less than the trench width. If desired, the trenches may have a high aspect ratio, i.e., the depth much larger than the width. The depths and other geometrical properties of the trenches can be determined so as to effectively provide optical and electrical isolation between adjacent devices. The trenches are typically deep enough to penetrate the sensitive regions between the devices and physically separate the adjacent devices.

A typical approach to etch the deep trenches may include the steps of photolithography and anisotropic etching. For example, depending on the desired depth of the trenches, a suitable etch mask may be selected. For relatively shallow trenches, a soft mask such as a photoresist mask of a few microns may be used. For trenches deeper than 5 μm, a hard mask such as a nickel or aluminum metal mask may be appropriate. In the case of a metal etch mask, an image-reversal photolithography may be combined with a metal lift-off process to define the trench opening patterns on the semiconductor wafer surface. The openings in the mask layer expose the underlying wafer surface in predetermined locations for the trenches. Then the wafer may be subjected to an anisotropic etching process, such as reactive ion etching (RIE) or an inductively coupled plasma (ICP) process, for example. After etching, additional process steps may be utilized to remove the etch mask and clean up any etching by-product from the wafer surface and the trenches. Other lithography or etching techniques may also be used to achieve the same purpose of etching deep trenches into the semiconductor wafer.

At step 104, the inside of the trenches may be coated with a layer of oxide, such as silicon dioxide ($SiO_2$), or other electrically insulating material. Other suitable electrically insulating materials which may be used include hafnium oxide ($HfO_2$), scandium oxide ($ScO_2$), silicon nitride ($Si_3N_4$) or a combination of those with silicon dioxide. The coating may be formed through deposition or thermal growth, for example. For a silicon (Si) or silicon carbide (SiC) wafer, a thermal oxidation process may be used to grow a layer of silicon dioxide ($SiO_2$) out of the sidewalls and bottom of a deep trench. The thickness of the thermal oxide layer will depend on the oxidation process parameters. For semiconductor wafers that cannot be oxidized, a chemical vapor deposition (CVD) technique may be used to deposit a layer of insulating material such as oxide inside the trenches. Other processing techniques can also be used to coat the inside of the deep trenches with an insulating layer. An oxide coating inside the deep trenches may serve primarily as an electrical isolating material to prevent the vast majority of free carriers present in one device from being transported to an adjacent device.

At step 106, the trenches may be filled with an isolating material which optically isolates the adjacent devices. Selection of the isolating material is performed in accordance with the purpose of providing optical isolation between adjacent devices. The optically isolating material may also provide additional electrical isolation between devices. Preferably, the trench-filling, isolating material is conformal. That is, the material, when deposited, can substantially follow the contour of the structure being covered. For example, one type of conformal coating may be able to cover all parts of a complex topology, including high aspect-ratio features, such as the corners and sidewalls of trenches or mesas, in equal thickness without gap. According to one embodiment of the present invention, polycrystalline silicon (also referred to as polysilicon) is used as the isolating material due to optical properties. Additionally, a layer of polysilicon deposited with a low pressure chemical vapor deposition (LPCVD) process can provide conformal coverage of the corners, sidewalls and bottom of a trench. By conformally depositing a layer of isolating material whose thickness is approximately half the width of the deep trenches, the trenches may be filled and their openings closed up. This trench-filling process may leave a layer of isolating material of about the same thickness above the top surface of the wafer. Other suitable optically isolating materials include titanium (Ti), aluminum (Al) and tungsten (W). These materials have properties that allow for a conformal deposition at temperatures less than 500° C. and are opaque to the radiation band of interest, which may be from 200 nanometers to approximately 450 nm, for example.

At step 108, the top surface of the semiconductor wafer may be planarized. The purpose of this step is to have a substantially flat surface on the processing side of the wafer so that subsequent processing steps which also include the exposure of part of the semiconductor surface may be carried out without significant topology problems. To achieve this purpose, the portion of isolating material above the exposed surface of the semiconductor wafer may be removed with one or more processing techniques. One way to remove this portion of isolating material is to oxidize it and then remove the resulting oxide, e.g., with wet chemical etch. In the case of a SiC wafer, for example, the oxidation rate of polysilicon is much greater than that of SiC, thus very little of the SiC semiconductor material would be consumed in the process. Another way is to selectively etch away this portion of isolating material with a plasma etcher. Yet another way is to subject the wafer to a chemical mechanical polishing (CMP) process. These methods may be combined while other planarization methods are also possible.

The process ends at step 110.

It should be appreciated that, although the trench isolation steps in accordance with exemplary embodiments of the present invention typically occur at or near the beginning of a semiconductor fabrication process, they may also occur in a later stage of a modified fabrication process.

FIGS. 2 through 6 illustrate cross-sectional views of a wafer in a sequence of processing steps according to an exemplary embodiment of the invention. With reference to these drawings, an exemplary method for optical and electrical isolation between adjacent integrated devices in a silicon carbide (SiC) wafer will be described in greater detail.

Figure 2:
FIGS. 2 through 6 illustrate cross-sectional views of a wafer in a sequence of processing steps according to an exemplary embodiment of the invention.

FIG. 2 shows the top surface of a SiC wafer 200 and two device sites: Site-A and Site-B. The edges or bottom of the wafer are not shown. SiC wafer 200 may have one or more epitaxial layers. It may also have a number of device sites where integrated devices are to be fabricated. Some of the device sites may have been defined in the form of channels, wells and active regions by ion implants. Site-A and Site-B represent two of those sites that are to be isolated from each other. SiC substrates and epitaxial layers may be obtained commercially from several companies, such as Cree Inc. of Durham, N.C.

Figure 3:
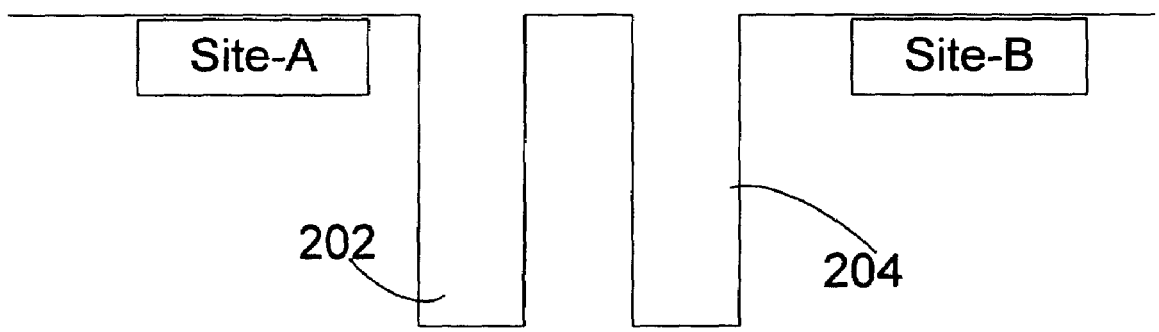

FIG. 3 shows the wafer cross section after two deep trenches, trench 202 and trench 204, have been formed between Site-A and Site-B. Depending on specific uses, one or more trenches may be positioned between or near adjacent devices. According to one example, two trenches or more are used to achieve isolation in adjacent silicon carbide devices, while at the same time, providing a photolithographic alignment tolerance to successive layers that may exist on one site, but not on the other. This configuration may be used, for example, based on the diffusion length of free charge carriers in SiC, which is generally accepted to be less than 5 microns. As the trenches typically have a width of less than 5 microns, two adjacent trenches and their spacing provide a total lateral dimension that is equal to or greater than two times the diffusion length, or 10 microns in the case of SiC. This configuration can prevent free carriers from diffusing from one device to its adjacent device. Other semiconductors may make use of fewer or more trenches, depending on the diffusion length of its free carriers. Trenches 202 and 204 may have high aspect-ratios. Their depths may be more than 10 microns while their openings may be less than 1 micron wide, for example. To achieve effective optical isolation and electrical insulation, the trenches may penetrate deeper than the epitaxial layer(s) or the implant depths of Site-A and Site-B. Thus, as shown in FIG. 3, the trenches 202, 204 extend below the boxes for Site A and Site B which represent the epitaxial layers or the implant depths.

In another example, if the epitaxial layers are doped very highly, e.g., greater than $10^{18}$ holes per cubic centimeter, the lifetime of minority carriers (electrons) may be extremely short. As a result, the diffusion length of electrons may be sufficiently small, for example a few tenths of a micron, such that only one trench may be adequate for ample optical and electrical isolation. However, multiple trenches may still be employed as they may aid in the alignment process of photolithography.

Figure 8:
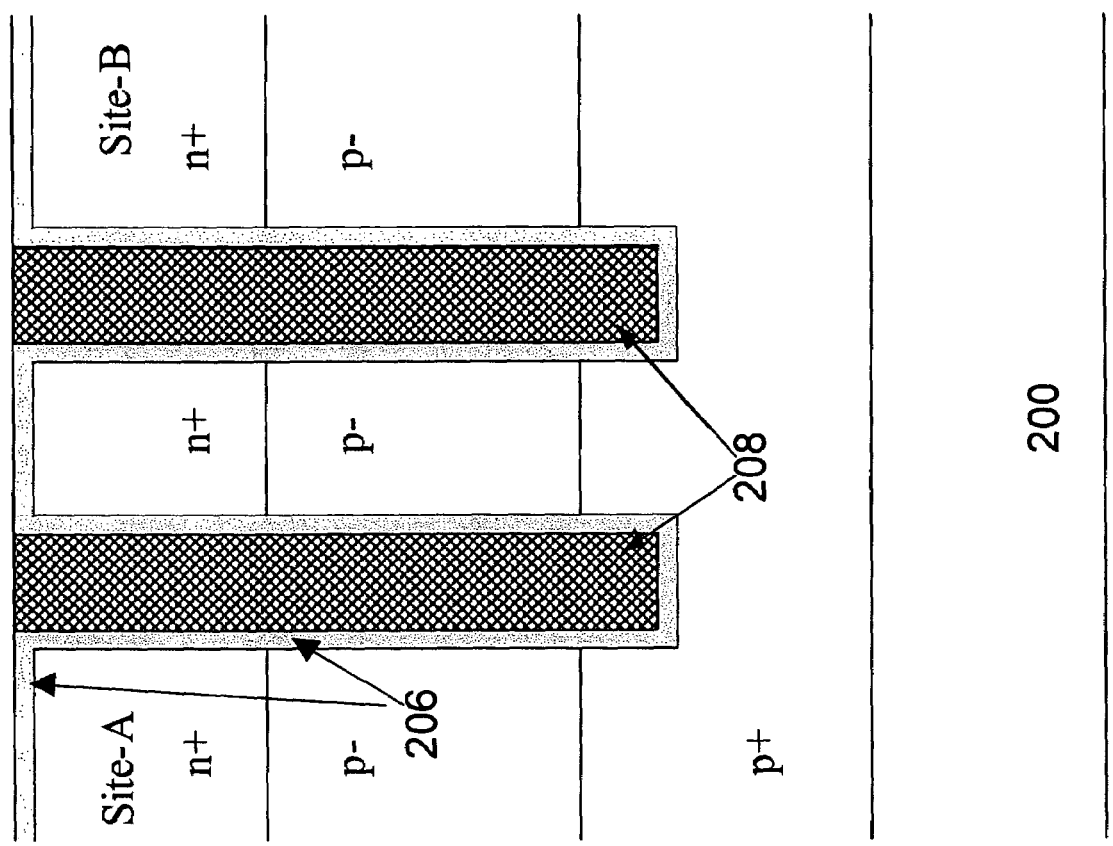

In still another example, the trenches may be etched deep enough such that they cut through the lightly doped layer (p−) as shown in FIG. 8. The electrons may be forced to flow through the heavily doped layer (p+), and thus have a greatly reduced probability for passing from site to site. In this case, only one trench may be needed, but multiple trenches may be utilized for aid in the alignment process as described earlier.

To achieve the trenches as shown in FIG. 3, standard reactive ion etching (RIE) processes with photolithography may be used. Further, inductively coupled plasma enhanced RIE may be used for the etching of some compound semiconductors such as silicon carbide. The depth and profile (e.g., sidewall angles) of the etch may be controlled by the etching conditions as well as the mask material. These etching techniques, in conjunction with various mask materials used during the etching process are well known in the art.

Figure 4:
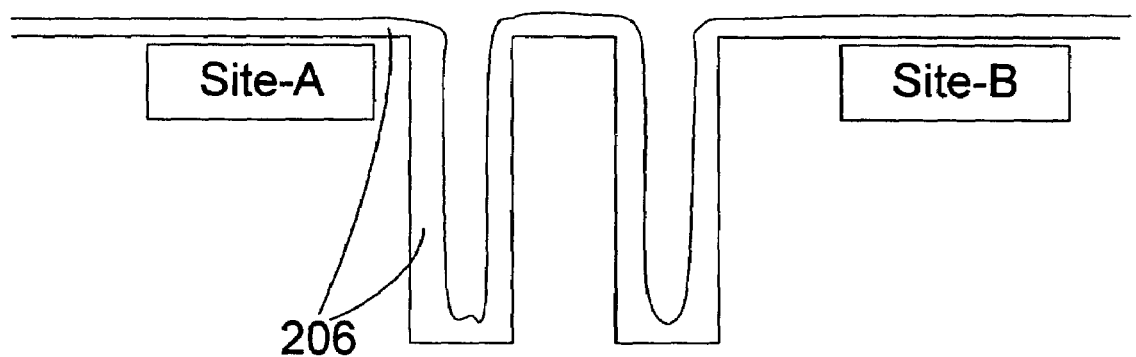

FIG. 4 shows the wafer cross section after the step of coating the electrically insulating layer (e.g., oxide layer). According to one embodiment of the invention, the SiC wafer is subjected to a high temperature thermal oxidation process. For example, the SiC wafer may be placed in a wet oxidation furnace at above 600° C. for a period of time sufficient to grow the necessary thickness. The growth rates of this process are largely dependent on the conditions used during the process, and may range from tens of Angstroms per hour to thousands of Angstroms per hour. A silicon dioxide ($SiO_2$) layer 206 forms on the sidewalls and the bottoms of the trenches. A similar layer of $SiO_2$ may also form on the top surface of the wafer. Since the oxidation rate of the carbon-face is typically much faster than the silicon-face in SiC material, the sidewalls of the trenches will have a thicker oxide coverage than in the bottom of the trench or on the wafer top surface. This layer of high-quality thermal oxide may serve as an isolating barrier against impurities and electrical carrier transport. Alternatively, a plasma-enhanced chemical vapor deposition (PECVD) process may be run to deposit a layer of electrically insulating material, e.g., oxide, inside the deep trenches.

Figure 5:
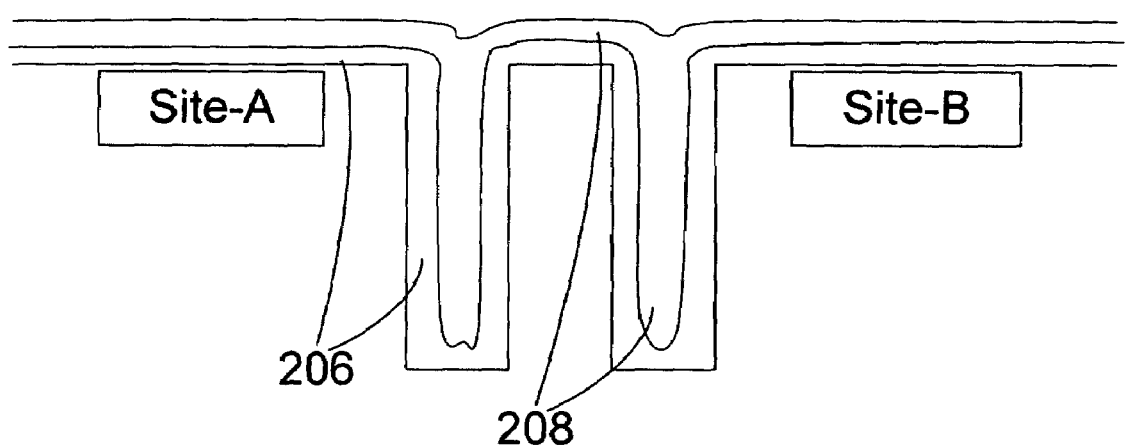

FIG. 5 shows the wafer cross section after the step of trench fill. The trenches may be filled by conformally depositing a layer of optically isolating material. For optical isolation purposes, polysilicon is a desirable isolating material for filling the trenches because it absorbs short wavelength radiation (below wavelengths of 1 micron). A low pressure chemical vapor deposition (LPCVD) polysilicon layer 208 may be deposited. Since polysilicon layer 208 evenly covers the corners, sidewalls and bottom of a trench, it may fill and close up the trenches after its deposited thickness reaches approximately half the width of the trench. After polysilicon deposition, a high-temperature step may be performed to anneal the thin films on the SiC wafer. Due to the presence of the trenches, small dips or holes may form in polysilicon layer 208 over the trench openings, leaving an uneven top surface of the wafer. Other suitable optically isolating materials include titanium, aluminum, and tungsten.

Figure 6:
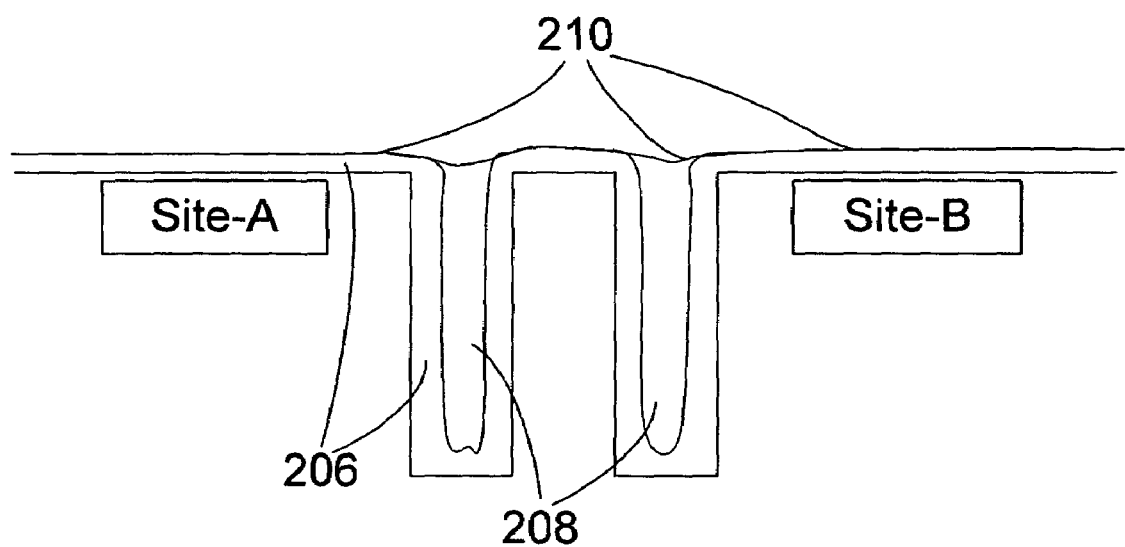

FIG. 6 shows the wafer cross section after the step of surface planarization. This step substantially flattens top surface 210 of the wafer by removing the excess polysilicon on top of the wafer. According to one embodiment of the present invention, the wafer may be subjected to a wet or dry thermal oxidation process where the portion of polysilicon on the top surface reacts with a water steam or oxygen and turns into oxide. The resulting oxide layer may then be removed with wet chemicals such as hydrofluoric acid (HF). Or the excessive polysilicon may be removed directly by anisotropic plasma etching or chemical mechanical polishing (CMP). The polysilicon removal process may also etch away part of silicon dioxide layer 206 left on the top surface of the wafer. However most of the trench-coating silicon dioxide layer 206 and trench-filling polysilicon layer 208 will be intact. After planarization of the top surface, the wafer is now ready for subsequent fabrication processes.

Figure 7:
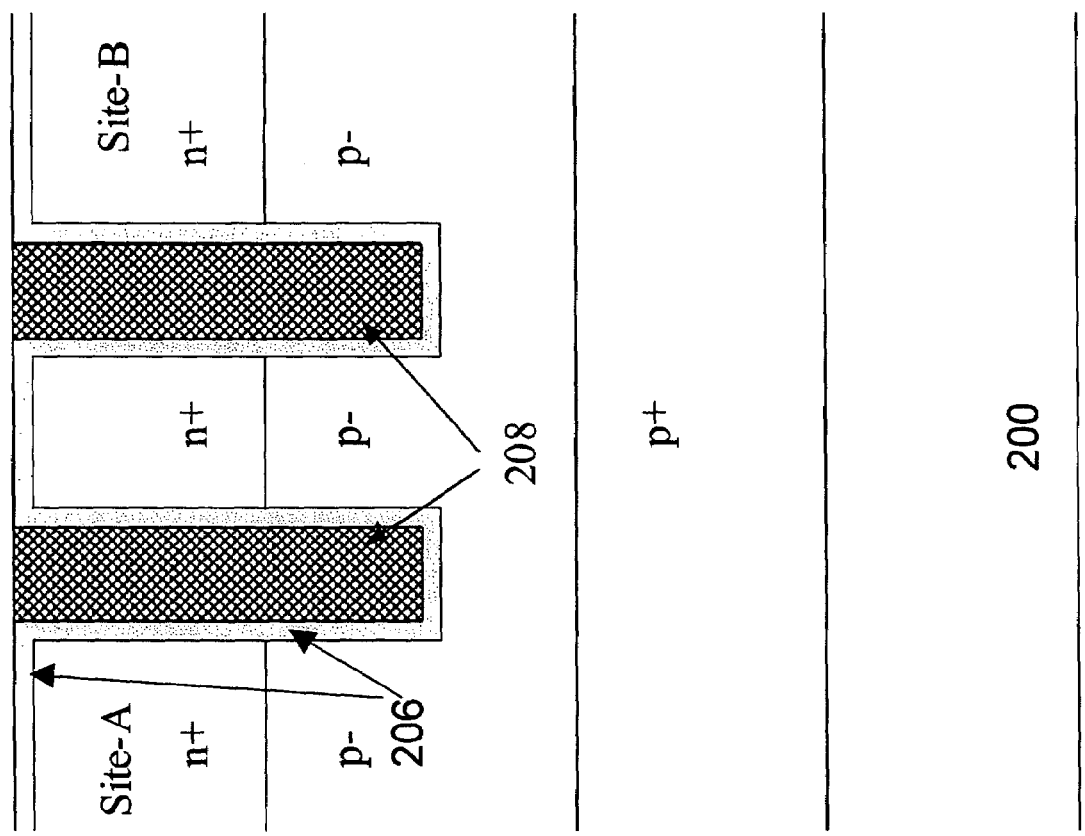
FIGS. 7 through 9 illustrate cross-sectional views of trench structures of varying depth according to embodiments of the invention.
Figure 9:
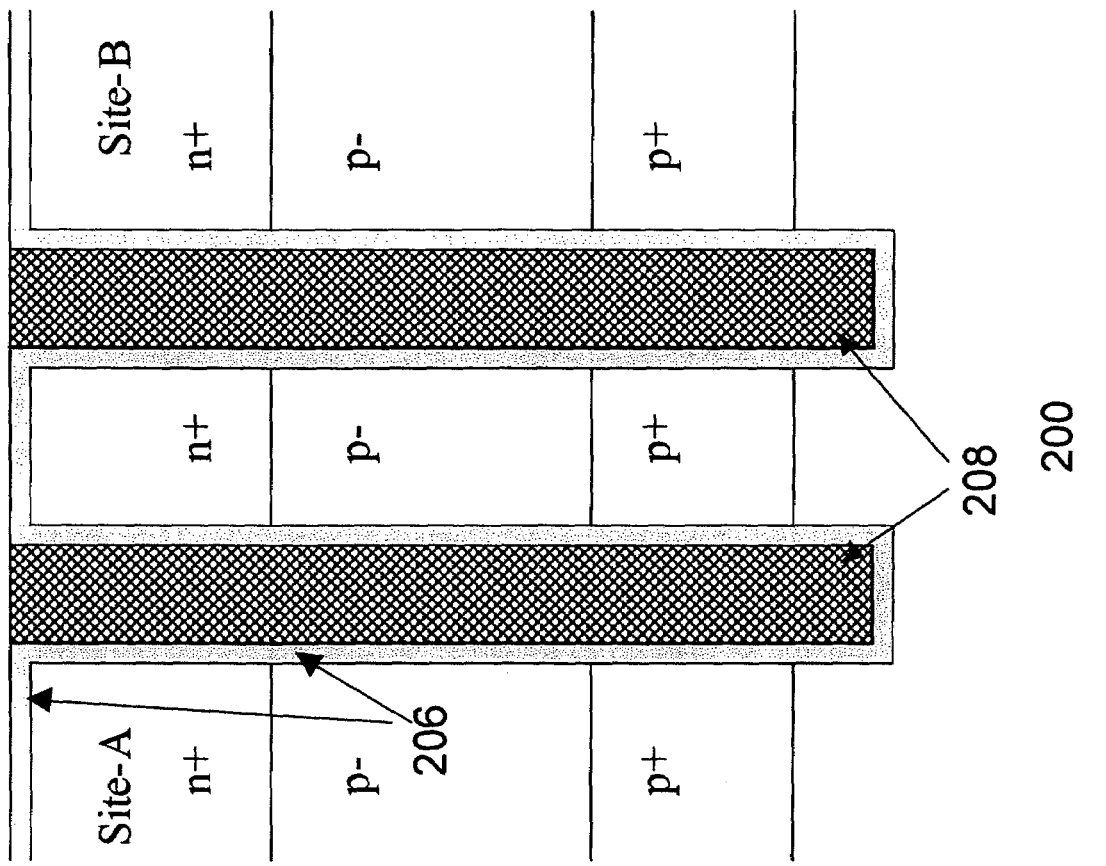

FIGS. 7 through 9 illustrate cross-sectional views of trench structures of varying depth according to exemplary embodiments of the invention. As shown, these exemplary trench structures reside in a semi-insulating substrate 200 having p+, p− and n+ doped epitaxial layers. The structures include an electrically insulating material 206 such as silicon dioxide and an optically isolating material 208 such as polysilicon. The trenches in FIG. 7 are relatively shallow, only fully penetrating the topmost n+ region. They provide electrical and optical isolation between the n+ regions of Sites A and B. Though FIG. 7 shows two trenches, a single trench or multiple trenches may be used to achieve the same degree of isolation. The two trenches shown are for purposes of easing alignment tolerance to Sites A and B in successive levels. This method may be susceptible to a conducting surface channel formed at the trench surface in the p− region depending on process conditions and doping level of the p− region. In FIG. 8, the trenches penetrate moderately deeply into the substrate. They not only provide electrical and optical isolation between the n+ regions of Sites A and B as in FIG. 7, but also help avoid a conduction path through a possible parasitic conducting channel formed at the trench edges in the p− region (the parasitic channel is suppressed in the p+ layer). The trenches shown in FIG. 9 are very deep trenches. They cut through the doped regions and into the semi-insulating substrate. The trenches in FIG. 9 provide electrical and optical isolation between Sites A and B p-n junctions in both forward and reverse bias.

Figure 10:
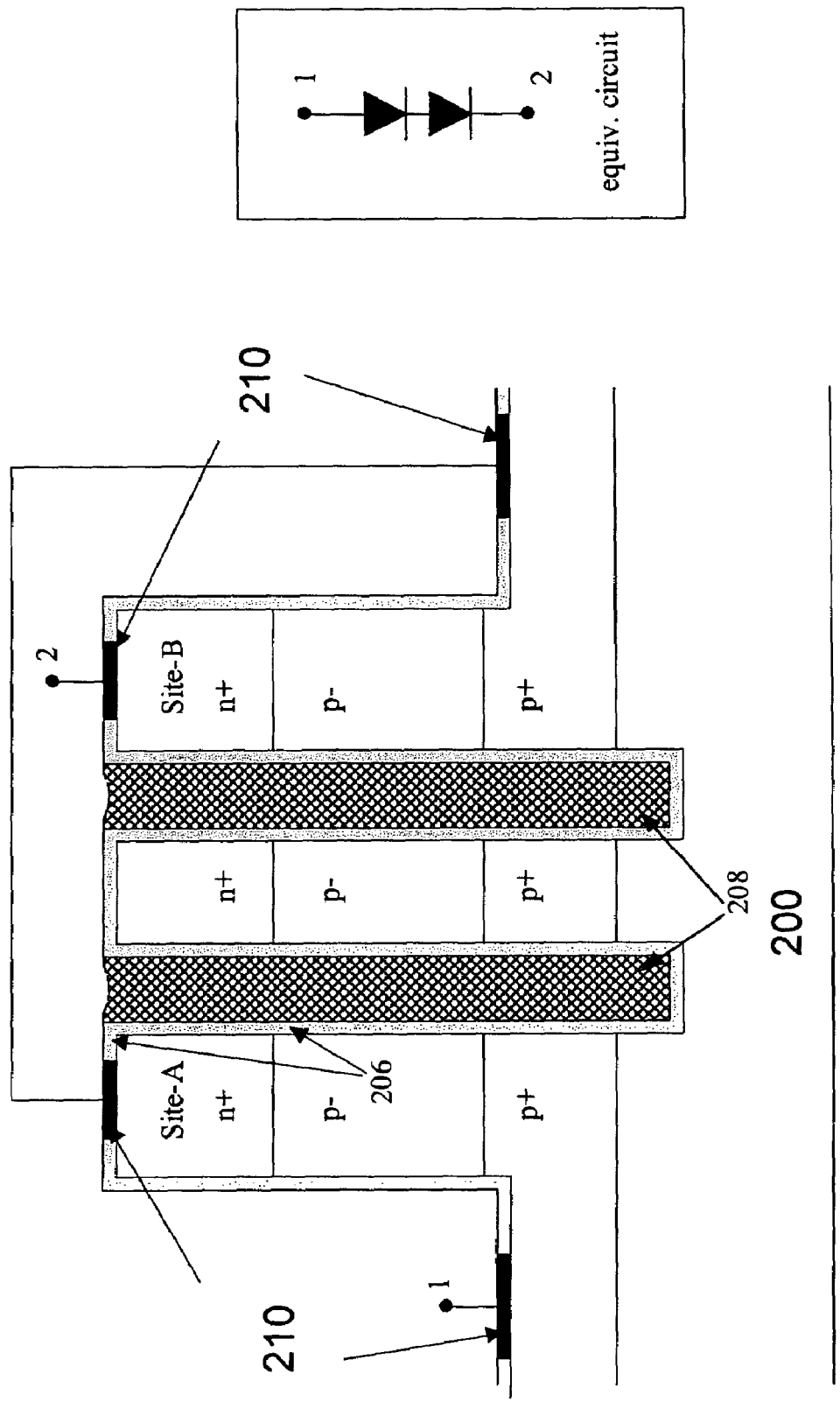
FIG. 10 illustrates an exemplary application of the devices shown in FIG. 9 according to an embodiment of the invention.

FIG. 10 illustrates an exemplary application of the devices shown in FIG. 9 according to an embodiment of the invention. By making an electrical connection between the n+ region of Site A and the p+ region of Site B with metal contacts 210, the devices between terminals 1 and 2 form an equivalent circuit of two electrically and optically isolated diodes connected in series. This type of circuit may be useful for light triggering applications.

Another embodiment of the present invention relates to providing optical and electrical isolation between adjacent photodiodes in a flame temperature sensor as disclosed in U.S. patent application Ser. No. 10/277,940, U.S. Publication No. 2003/0080294, entitled "Inter-digitated Flame Sensor, System and Method," filed on Oct. 23, 2002. According to this embodiment, the photodiodes are formed by epitaxial layers on an insulating substrate such as gallium nitride (GaN) on a sapphire ($Al_2O_3$) substrate, and the diode is isolated on all sides including the bottom, or base of the device. Epitaxial layers of GaN or AlGaN are grown on a sapphire wafer using metalorganic chemical vapor deposition, a technique commonly known by those skilled in the art of compound semiconductors. These epitaxial layers may be grown and doped in a similar fashion to those shown in FIGS. 7 through 10. Following that deposition, the layers may be etched in a similar fashion to the process shown in FIG. 1. In the case of GaN or AlGaN, the insulating material 206 may be deposited by means of a deposition technique such as plasma enhanced chemical vapor deposition (PECVD).

Another example of an optical device which can be formed in accordance with exemplary embodiments of the invention and shown in FIG. 11 is a photodiode array composed of a plurality of small diodes 212 that are serially connected to produce a suitable output voltage to trigger an insulated gate device 214 such as a power metal oxide field effect transistor (MOSFET) or an insulated gate bipolar transistor (IGBT). In this example, the SiC substrate is typically semi-insulating, thereby electrically isolating all the bases of the diodes. Top contacts to the cathode and anode are formed so that the diode array can be serially connected.

By utilizing the combination of optical and electrical isolation provided, a long, serially connected set of diodes may be fabricated without consuming a large amount of space on the surface of the semiconductor. Further, conventional diodes may suffer from electrical leakage between adjacent devices. The method described with reference to FIG. 1 can alleviate a requirement for large lateral spacing by preventing electrical leakage, or cross-talk, as well as preventing absorption and thus optically driven cross-talk.

While the foregoing description includes many details and specificities, it is to be understood that these have been included for purposes of explanation only, and are not to be interpreted as limitations of the present invention. It will be apparent to those skilled in the art that other modifications to the embodiments described above can be made without departing from the spirit and scope of the invention. Accordingly, such modifications are considered within the scope of the invention as intended to be encompassed by the following claims and their legal equivalents.

What is claimed is:

1. A method for optical and electrical isolation between adjacent integrated devices, the method comprising:
    forming at least one trench through an exposed surface of a silicon carbide (SiC) or gallium nitride (GaN) semiconductor wafer by removing a portion of the semiconductor wafer material;
    forming an electrically insulating layer on the sidewalls and the bottom of the at least one trench, wherein forming an electrically insulating layer comprises growing or depositing an oxide layer on the sidewalls and the bottom of the at least one trench;
    filling the at least one trench by conformally depositing an optically isolating material; and
    planarizing the semiconductor wafer surface by removing the portion of the optically isolating material above the exposed surface of the semiconductor wafer.

2. The method according to claim 1, wherein the step of forming an electrically insulating layer comprises growing a silicon dioxide (SiO2) layer on the sidewalls and the bottom of the at least one trench.

3. The method according to claim 1, wherein the step of forming an electrically insulating layer comprises growing or depositing a layer comprising at least one of hafnium oxide, and scandium oxide, on the sidewalls and the bottom of the at least one trench.

4. The method according to claim 1, wherein the optically isolating material comprises an opaque material capable of being deposited conformally.

5. The method of claim 4, wherein the optically isolating material can be deposited at a temperature below 500° C.

6. The method according to claim 1, wherein the optically isolating material comprises one or more of:
    low pressure chemical vapor deposition (LPCVD) polysilicon;
    titanium;
    aluminum; or
    tungsten.

7. The method according to claim 1, wherein the optically isolating material comprises polysilicon.

8. The method according to claim 1, wherein the electrically insulating material comprises silicon dioxide and the optically isolating material comprises polysilicon.

9. The method according to claim 1, wherein the at least one trench is located between a plurality of adjacent device sites.

10. The method according to claim 1, wherein the step of forming at least one trench comprises selectively etching the semiconductor wafer with reactive ion etching (RIE) or an inductively coupled plasma (ICP) process.

11. The method according to claim 1, wherein the step of planarizing the semiconductor wafer surface comprises:
    oxidizing the portion of the optically isolating material above the exposed surface of the semiconductor wafer; and
    removing the oxidized portion of the optically isolating material.

12. The method according to claim 1, wherein the step of planarizing the semiconductor wafer surface comprises subjecting the portion of the optically isolating material above the exposed surface of the semiconductor wafer to an etching process.

13. The method according to claim 1, wherein the step of planarizing the semiconductor wafer surface comprises subjecting the portion of the optically isolating material above the exposed surface of the semiconductor wafer to a chemical mechanical polishing (CMP) process.

14. A microelectronic device comprising:
    at least two integrated devices, wherein the at least two integrated devices are located in a silicon carbide (SiC) or gallium nitride (GaN) substrate; and
    at least one trench in the substrate, wherein the at least one trench physically separates the at least two integrated devices, and the inside of the at least one trench is coated with an electrically insulating material, and filled with an optically isolating material that is conformally deposited, and planarized by removing a portion of the optically isolating material above an exposed surface of the substrate, wherein the electrically insulating material comprises an oxide layer.

15. The microelectronic device according to claim 14, wherein the electrically insulating material comprises a thermally grown silicon dioxide.

16. The microelectronic device according to claim 14, wherein the optically isolating material comprises a low pressure chemical vapor deposition (LPCVD) polysilicon.

17. The microelectronic device according to claim 14, wherein the electrically insulating material comprises one or more of:
 hafnium oxide; or
 scandium oxide.

18. The microelectronic device according to claim 14, wherein the optically isolating material comprises one or more of:
 low pressure chemical vapor deposition (LPCVD) polysilicon;
 titanium;
 aluminum; or
 tungsten.

19. The microelectronic device according to claim 14, wherein the optically isolating material comprises an opaque material that can be deposited conformally under 500° C.

20. The microelectronic device according to claim 14, wherein the at least two integrated devices comprise photodiodes.

21. The microelectronic device according to claim 14, wherein the at least two integrated devices comprise photoemitters.

22. The microelectronic device according to claim 14, wherein the at least two integrated devices comprise an array of serially connected diodes working as a gate to an insulated gate bipolar transistor (IGBT) or a metal-oxide-semiconductor field effect transistor (MOSFET).

* * * * *